(12) United States Patent
Jeong et al.

(10) Patent No.: US 8,030,129 B2
(45) Date of Patent: Oct. 4, 2011

(54) METHOD OF FABRICATING NONVOLATILE MEMORY DEVICE

(75) Inventors: Ji-Hyun Jeong, Seoul (KR); Jae-Hee Oh, Seongnam-si (KR); Jae-Hyun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/655,047

(22) Filed: Dec. 21, 2009

(65) Prior Publication Data

US 2010/0159638 A1 Jun. 24, 2010

(30) Foreign Application Priority Data

Dec. 24, 2008 (KR) .................. 10-2008-0133677

(51) Int. Cl.
*H01L 21/06* (2006.01)
(52) U.S. Cl. .............. 438/102; 257/5; 257/E21.068; 257/E21.233; 257/E27.004; 257/E45.002
(58) Field of Classification Search ............. 438/102, 438/637; 257/5, E45.002, E21.068, E21.233, 257/E27.002, E27.004, E47.001; 216/39
See application file for complete search history.

(56) References Cited

U.S. PATENT DOCUMENTS

| 7,572,572 | B2 * | 8/2009 | Wells .................... 430/311 |
| 2006/0124916 | A1 | 6/2006 | Lung |
| 2007/0111487 | A1 | 5/2007 | Kim et al. |
| 2007/0152205 | A1 | 7/2007 | Chen |
| 2009/0004841 | A1 * | 1/2009 | Supriya et al. ............. 438/637 |
| 2010/0072454 | A1 * | 3/2010 | Aburada et al. ............. 257/5 |
| 2010/0144138 | A1 * | 6/2010 | Park et al. ............. 438/637 |

FOREIGN PATENT DOCUMENTS

| KR | 100684889 B1 | 2/2007 |
| KR | 100795908 B1 | 1/2008 |

* cited by examiner

*Primary Examiner* — Mary Wilczewski
*Assistant Examiner* — Toniae M Thomas
(74) *Attorney, Agent, or Firm* — Onello & Mello, LLP

(57) ABSTRACT

A method of manufacturing a nonvolatile memory device including forming on a lower insulating layer a first sacrificial pattern having first openings extending in a first direction, forming a second sacrificial pattern having second openings extending in a second direction on the lower insulating layer and the first sacrificial pattern wherein the second openings intersect the first openings, etching the lower insulating layer using the first and second sacrificial patterns to form a lower insulating pattern having contact holes defined by a region where the first and second openings intersect each other, forming a bottom electrode in the contact holes, and forming a variable resistance pattern on the lower insulating pattern so that a portion of the variable resistance pattern connects to a top surface of the bottom electrode.

18 Claims, 14 Drawing Sheets

FIG. 1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) || SA/WD(20_2) || SA/WD(20_3) || SA/WD(20_4) ||
| PERIPHERY(30) |||||||||
| SA/WD(20_8) || SA/WD(20_7) || SA/WD(20_6) || SA/WD(20_5) ||
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

METHOD OF FABRICATING NONVOLATILE MEMORY DEVICE

CROSS-REFERENCE TO RELATED APPLICATION

This application claims priority under 35 U.S.C. 119 to Korean Patent Application No. 10-2008-0133677, filed on Dec. 24, 2008 in the Korean Intellectual Property Office, contents of which are herein incorporated by reference in their entirety.

BACKGROUND

1. Field of the Invention

The present inventive concept relates to a method of fabricating a nonvolatile memory device, and more particularly, to a method of fabricating a nonvolatile memory device using a resistive element.

2. Description of the Related Art

Examples of nonvolatile memory devices which use a resistance material may include a phase change random access memory (PRAM) device, a resistive random access memory (RRAM) device, and a magnetic random access memory (MRAM) device. Such nonvolatile memory devices which use a resistance material may store data by using variations in the state of a phase change material, for example, a chalcogenide alloy, variations in the resistance of a variable resistor, or variations in the resistance of a magnetic tunnel junction (MTJ) thin film with respect to the magnetization of a ferromagnetic material. Whereas Dynamic random access memory (DRAM) devices or flash memory devices may store data using charge.

For example, PRAM devices define a crystalline phase of a phase change material as a set state or a logic value of "0" and define the amorphous phase of a phase change material as a reset state or a logic value of "1." This is due to the fact that a phase change material has a lower resistance in the crystalline phase and has a higher resistance in the amorphous state. In PRAM devices, a write pulse, for example, a set pulse and/or a reset pulse, may be provided to a phase change material, and data may be written to the phase change material with joule heat generated by the write pulse. For example, PRAM devices may apply a write pulse, for example, a set pulse and/or a reset pulse, to phase change materials and write data to the phase change materials using joule heat generated by the write pulse. PRAM devices may write a logic value of "1" to phase change materials by heating the phase change materials to their melting point or higher using a reset pulse and quickly cooling the phase change materials so that the phase change materials become amorphous. PRAM devices may write a logic value of "0" to phase change materials by heating the phase change materials to a temperature between the crystallization temperature and the melting point using a set pulse, and, then, maintaining the temperature of the phase change materials for a given amount of time so that the phase change materials may become crystalline.

SUMMARY

The present inventive concept provides a method of fabricating a nonvolatile memory device with low power dissipation and high operation reliability.

According to an aspect of the present inventive concept, there is provided a method of manufacturing a nonvolatile memory device including forming a first sacrificial pattern having first openings extending in a first direction on a lower insulating layer, forming a second sacrificial pattern having second openings extending in a second direction on the lower insulating layer and the first sacrificial pattern wherein the second openings intersect the first openings, etching the lower insulating layer using the first and second sacrificial patterns as a mask to form a lower insulating pattern having contact holes defined by a region where the first and second openings intersect with each other, forming a bottom electrode in the contact holes, and forming a variable resistance pattern on the lower insulating pattern so that a portion of the variable resistance pattern connects to a top surface of the bottom electrode.

In one embodiment, the method further includes forming a vertical cell diode within the contact hole. The bottom electrode is formed on the vertical cell diode.

In another embodiment, the forming of the bottom electrode includes conformally forming a conductive layer on the vertical cell diode and along sidewalls of the contact hole, forming a first internal insulating layer on the conductive layer so as to fill up the contact hole, and removing the conductive layer formed along portions of the sidewalls of the contact hole to form the bottom electrode. In another embodiment, the method further includes forming a second internal insulating layer on the bottom electrode to fill the contact hole. In another embodiment, the contact hole has a quadrilateral shape including opposite first and second sidewalls and opposite third and fourth sidewalls adjacent to the first sidewall, and, in the removing of the conductive layer formed along portions of the sidewalls of the contact hole, the conductive layer formed along the first sidewall and portions of the third and fourth sidewalls are etched from a top surface of the contact hole.

In another embodiment, the bottom electrode includes a base and a sidewall formed along edges of the base, and the method further includes forming an internal insulating layer on the bottom electrode to fill the contact hole and forming an upper insulating pattern on the lower insulating pattern to cover a portion of a top surface of the sidewall.

In one embodiment, the method further includes forming bit lines extending in the second direction on the variable resistance pattern. The contact hole has a width extending along the first direction and a length extending along the second direction and the width is greater than the length. In another embodiment, the variable resistance pattern extends along the second direction and the variable resistance pattern has a width less than the width of the contact hole. In another embodiment, the variable resistance pattern includes a phase change material.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

FIGS. 1 and 2 are a block diagram and a circuit diagram, respectively, of a nonvolatile memory device according to an embodiment of the present inventive concept;

DETAILED DESCRIPTION OF THE EMBODIMENTS

Figure 2:
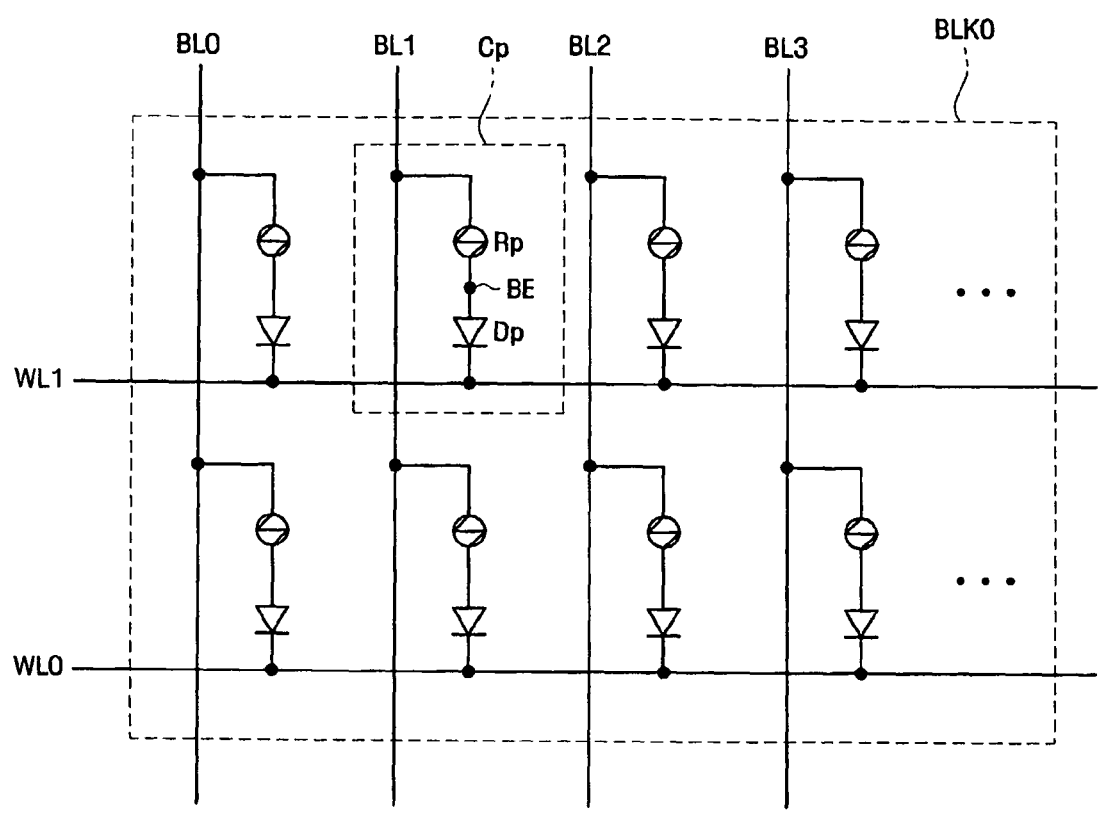

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

Exemplary embodiments of the invention are described herein with reference to cross-section illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, a description will be made of embodiments of the present invention by using phase change random access memory (PRAM) devices. However, it will be apparently understood by those skilled in the art that the present invention can be applied to nonvolatile memory devices that use resistance materials, such as resistive RAM (RRAM) devices, ferroelectric RAM (FRAM) devices, and the like.

FIGS. 1 and 2 are a block diagram and a circuit diagram, respectively, of a nonvolatile memory device according to an embodiment of the present inventive concept. For convenience of explanation, in the embodiments described herein, the nonvolatile memory device includes sixteen memory banks. However, it is to be understood that the present invention is not limited thereto. FIG. 2 illustrates only the first memory block BLK0.

Referring to FIG. 1, a nonvolatile memory device according to an embodiment of the present inventive concept includes a plurality of memory banks 10_1 through 10_16, a plurality of sense amplifiers/write drivers 20_1 through 20_8, and a peripheral circuit area 30.

Each of the plurality of memory banks 10_1 through 10_16 includes a plurality of memory blocks BLK0 through BLK7. Each of the plurality of memory blocks BLK0 through BLK7 includes a plurality of phase change memory cells arranged in a matrix. While FIG. 1 illustrates each memory bank includes eight memory blocks, the memory bank may include a different number of memory blocks.

Although not illustrated in the drawings, the nonvolatile memory device according to the present embodiment further includes row decoders and column decoders corresponding to memory banks 10_1 through 10_16, which, respectively, select rows and columns of phase change memory cells to or from which data will be written or read.

Each of the plurality of sense amplifiers/write drivers 201 through 20_8 corresponds to two of the memory banks 10_1 through 10_16 and reads and/or writes data to and/or from the corresponding memory banks. However, the sense amplifiers/write drivers 20_1 through 20_8 are not limited thereto, and each sense amplifier/write driver may correspond to one to four memory banks.

The peripheral circuit area 30 includes a plurality of logic circuit blocks and voltage generators that operate the row decoder, the column decoder, and the sense amplifiers/write drivers 20_1 through 20_8.

Referring to FIG. 2, the memory block BLK0 in the nonvolatile memory device includes a plurality of memory cells Cp, a plurality of bit lines BL0 through BL3, and a plurality of word lines WL0 and WL1.

The plurality of memory cells Cp are arranged at the intersections between the word lines WL0 and WL1 and the bit lines BL0 through BL3. Each memory cell Cp switches between crystalline and amorphous states depending on current passing therethrough and includes a variable resistive element Rp whose resistance varies according to its phase and a vertical cell diode Dp that is coupled to the variable resistive element Rp through a bottom electrode BE. The vertical cell diode Dp controls the current flowing through the variable resistive element Rp. The variable resistive element Rp may contain a phase change material having various kinds of materials, such as GaSb, InSb, InSe, $Sb_2Te_3$, and GeTe in which two elements are chemically combined with each other, GeSbTe, GaSeTe, InSbTe, $SnSb_2Te_4$, and InSbGe in which three elements are chemically combined with one another, and AginSbTe, (GeSn)SbTe, GeSb(SeTe), and $Te_{81}Ge_{15}Sb_2S_2$ in which four elements are chemically combined with one another. In an exemplary embodiment, a GeSbTe that contains germanium (Ge), antimony (Sb), and tellurium (Te) is used as the phase change material. While FIG. 2 illustrates that the variable resistive element Rp and the vertical cell diode Dp are respectively coupled to corresponding ones of the bit lines BL0 through BL3 and word lines WL0 and WL1, the variable resistive element Rp may be coupled to one of the word lines WL0 and WL1 and the vertical cell diode Dp may be coupled to the corresponding one of bit lines BL0 through BL3.

Hereinafter, the operation of the nonvolatile memory device is described with reference to FIG. 2.

When the nonvolatile memory device performs a write operation, the variable resistive element Rp is heated to a temperature higher than a melting temperature Tm and rapidly cooled to achieve an amorphous state having a logic level "1". Otherwise, the variable resistive element Rp is heated to a temperature between the crystallization temperature Tx and the melting temperature Tm, maintained at the temperature for a predetermined amount of time, and cooled to a crystalline state having a logic level "0". A considerably high level of write current is required to pass through the variable resistive element Rp to induce phase changes. For example, a reset write current of about 1 mA and a set write current of 0.6 to 0.7 mA may be applied to the variable resistive element Rp. The reset and set write current flows from a write circuit (not shown) through the bit lines BL0 through BL3 and the vertical cell diode Dp to ground.

During a read operation, the nonvolatile memory device applies a read current that is sufficiently low, so as not to induce a phase change to the variable resistive element Rp to read stored data from the variable resistive element Rp. The read current flows from a read circuit (not shown) through the bit lines BL0 through BL3 and the vertical cell diode Dp to ground.

Figure 3:
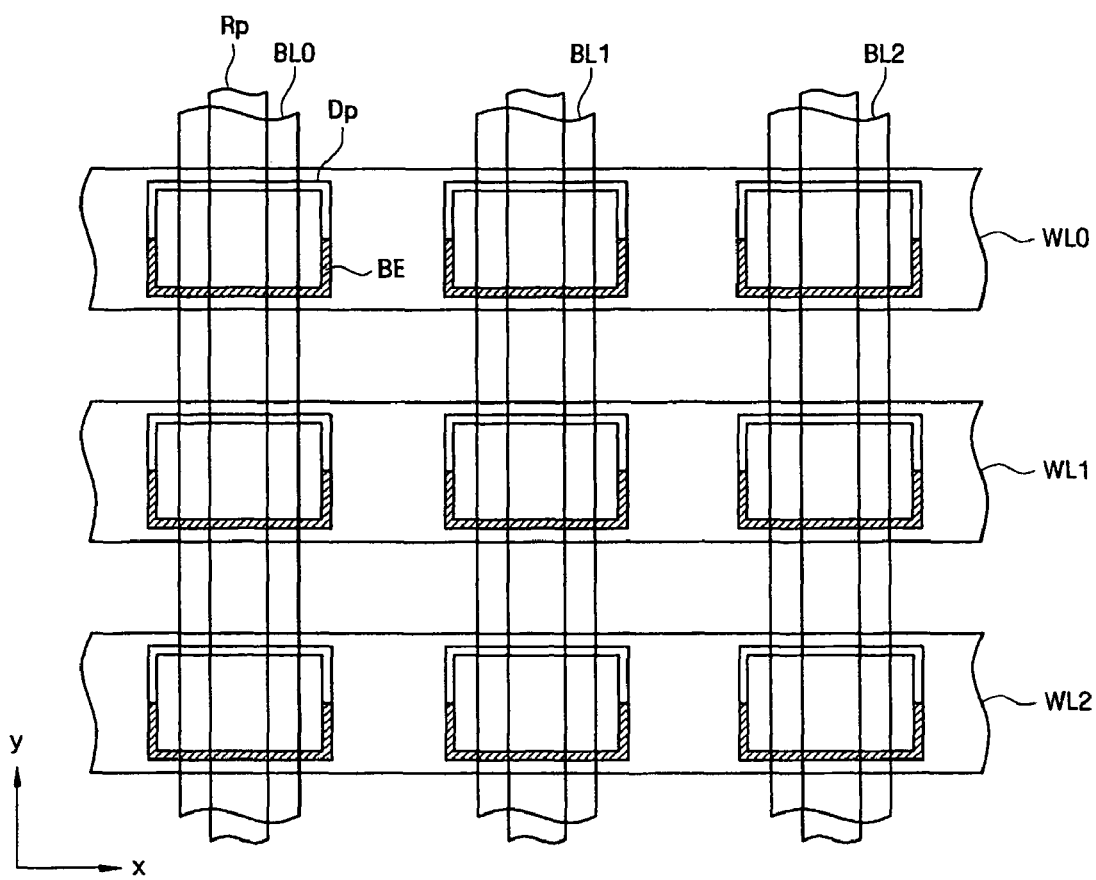
FIG. 3 is a layout diagram of a nonvolatile memory device according to an embodiment of the present inventive concept.

Next, a method of manufacturing a nonvolatile memory device according to an embodiment of the present inventive concept is described with reference to FIGS. 3 and 4a through 4j. FIG. 3 is a layout diagram of a nonvolatile memory device according to an embodiment of the present inventive concept. FIGS. 4a through 4j are perspective views of resultant structures of intermediate processing steps of a method of fabricating a nonvolatile memory device according to an embodiment of the present inventive concept. FIGS. 5a and 5b illustrate exemplary bottom electrodes that are formed during a process of manufacturing a nonvolatile memory device according to an embodiment of the present inventive concept.

Figure 4A:
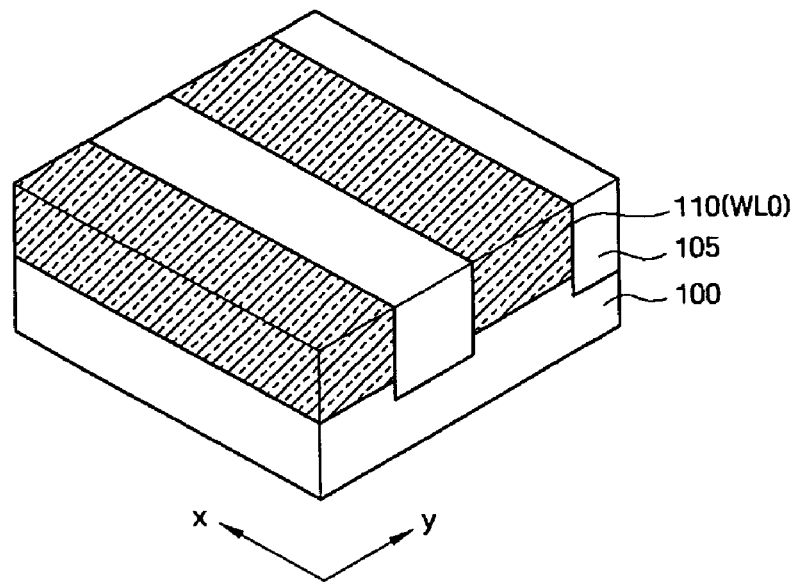
FIGS. 4a through 4j are perspective views of resultant structures of intermediate processing steps of a method of fabricating a nonvolatile memory device according to an embodiment of the present inventive concept.
Figure 5A:
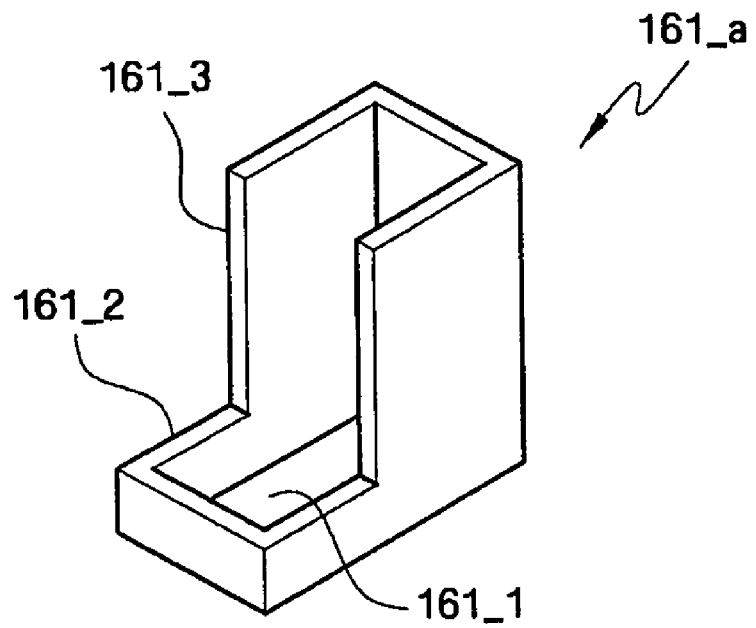
FIGS. 5a and 5b illustrate exemplary bottom electrodes that are formed during a process of manufacturing a nonvolatile memory device according to an embodiment of the present inventive concept.
Figure 5B:
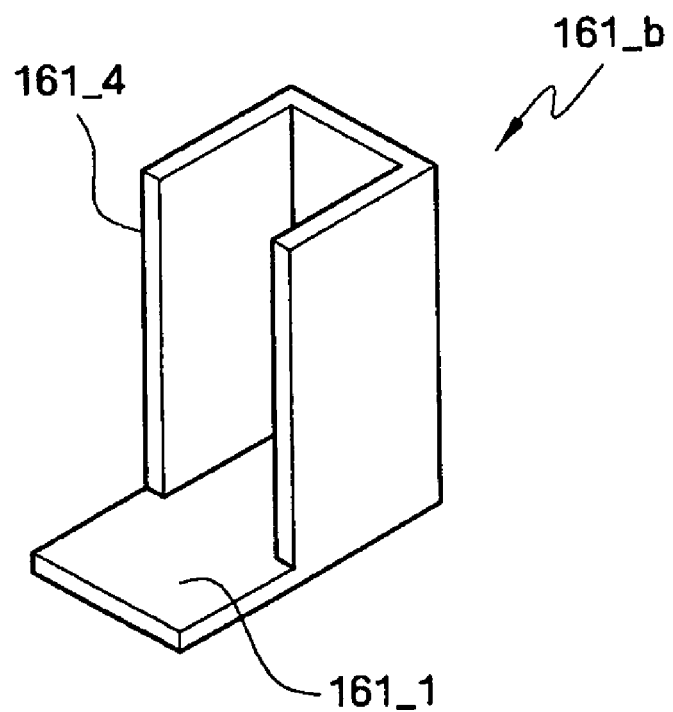

First, referring to FIGS. 3 and 4a, a device isolation region 105 is formed within a substrate 100 of a first conductivity type (for example, P-type) to define a plurality of active regions. For example, the plurality of active regions may extend along a first (x) direction parallel to each other. Impurities of a second conductivity type (for example, N-type) are implanted into the plurality of active regions to form word lines 110. The substrate 100 may be a silicon substrate, silicon on insulator (SOI) substrate, gallium arsenide (GaAs) substrate, or silicon germanium (SiGe) substrate.

Although the word lines 110 are described as being formed by implanting the impurities of the second conductivity type into the substrate 100 of the first conductivity type, the word lines 110 may be formed using an epitaxial growth technique. Specifically, after forming a mold pattern having a plurality of openings that expose a predetermined region of the substrate 100 on the substrate 100, an epitaxial layer is formed in each of the plurality of openings using selective epitaxial growth (SEG) or solid phase epitaxy (SPE). Subsequently, ion implantation is performed to implant impurities of the second conductivity type into the entire surface of the substrate 100 on which the epitaxial layer has been grown and to form a plurality of word lines 110. However, if the impurities are doped in situ during the SEG or SPE process, the ion implantation step may be unnecessary.

Figure 4B:
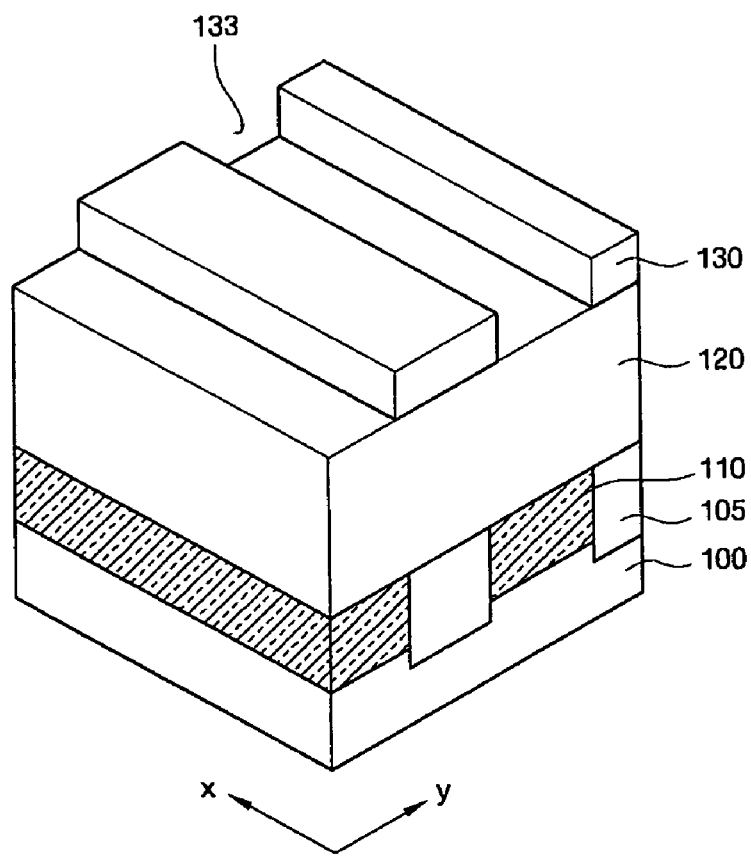

Referring to FIGS. 3 and 4b, a lower insulating layer 120 and a first sacrificial pattern 130 are sequentially formed on the substrate 100. More specifically, after sequentially forming the lower insulating layer 120 and a first sacrificial layer on the substrate 100, the first sacrificial layer is patterned to form the first sacrificial pattern 130. The first sacrificial pattern 130 has first openings 133 extending along the first (x) direction and is formed of a material having etch selectivity with respect to the lower insulating layer 120.

Figure 4C:
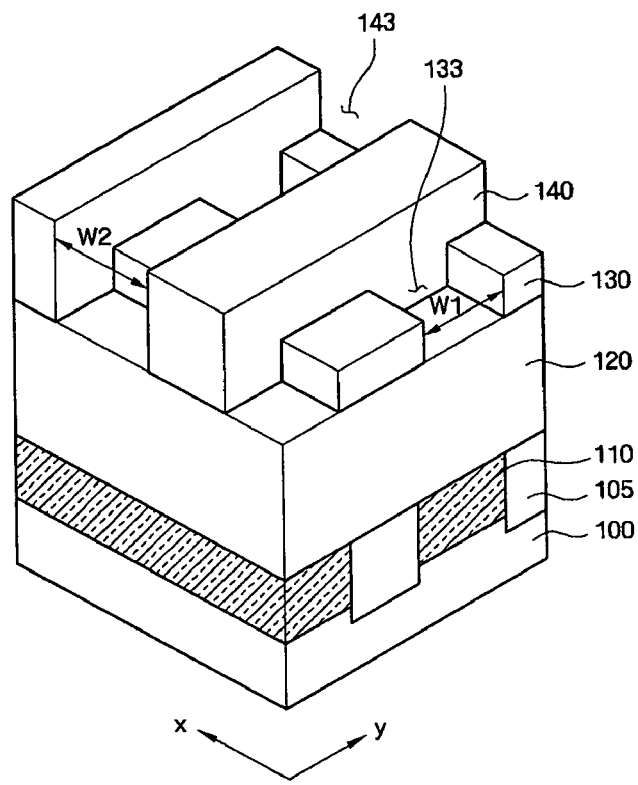

Referring to FIGS. 3 and 4c, a second sacrificial pattern 140 is formed on the first sacrificial pattern 130 to have second openings 143 extending along the second (y) direction. More specifically, a second sacrificial layer is formed on the lower insulating layer 120 and the first sacrificial pattern 130 and, then, patterned to form the second sacrificial pattern 140. The second openings 143 may intersect the first openings 133 and have a width W2 less than a width W1 of the first openings 133.

The second sacrificial pattern 140 may be formed of a material having etch selectivity with respect to the first sacrificial pattern 130 and the lower insulating layer 120. For example, the lower insulating layer 120, the first sacrificial pattern 130, and the second sacrificial pattern 130 may be formed of silicon dioxide (SiO2), silicon oxynitride (SiON), and silicon nitride (SiN), respectively.

Accordingly, the first and second sacrificial patterns 130 and 140 overlying the lower insulating layer 120 may be line patterns extending along the first (x) and the second (y) directions, respectively.

Although the first openings 133 in the first sacrificial pattern 130 and the second openings 143 in the second sacrificial pattern 140 have been described above to extend in the first (x) and the second (y) directions, respectively, the first and second openings 133 and 143 are not limited thereto. In another embodiment, the first openings 133 in the first sacrificial pattern 130 and the second openings 143 in the second sacrificial pattern 140 may be elongated in the second (y) and the first (x) directions, respectively.

Figure 4D:
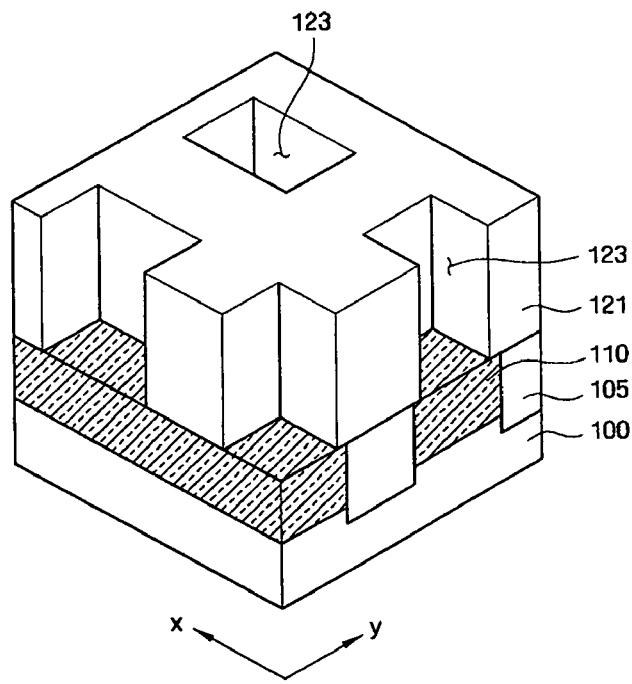

Referring to FIGS. 3 and 4d, the lower insulating layer 120 is thereafter etched using the first and second sacrificial patterns 130 and 140 as a mask to form a lower insulating pattern 121 having contact holes 123 exposing the underlying word lines 110. The contact hole 123 has a quadrilateral shape such as square or rectangle defined by a region where the first and second openings 133 and 143 intersect each other. In particular, as shown in FIG. 4d, the contact hole 123 may have a rectangular shape in which its width extending in the first (x)

direction is greater than its length extending in the second (y) direction. Formation of the lower insulating pattern 121 includes etching the lower insulating layer 120 using the first and second sacrificial patterns 130 and 140 as a mask and removing the first and second sacrificial patterns 130 and 140.

Forming the contact holes 123 using the first and second sacrificial patterns 130 and 140 as a mask is more advantageous for scaling of the contact holes 123 than using one sacrificial pattern (for example, a photoresist pattern) that defines the contact holes 123.

Specifically, if a sacrificial pattern with a rectangular array of openings is formed on the lower insulating layer 120 using a photolithography process to create a quadrilateral contact hole, it may be difficult to control the width and length of the openings due to limitations of the photolithography process (for example, photolithographic equipment). Further, the openings formed using a sacrificial pattern with a rectangular array may have an oval or circular shape with rounded corners of a large curvature. That is, when the lower insulating layer 120 is etched to form the contact hole 123 using the sacrificial pattern having the array, a problem occurs in that the width and length of the contact hole 123 are difficult to control and the shape is oval or circular. In particular, this problem becomes worse as the integration density of a nonvolatile memory device increases so that the contact hole 123 scales down.

In the above-described embodiment of the present inventive concept, the first and second elongated sacrificial patterns 130 and 140, whose widths and pitches are easy to control, are formed using a photolithography process, and the contact holes 123 are formed using the first and second sacrificial patterns 130 and 140 as a mask. Therefore, it is easier to control the width and length of the contact holes 123 than when one sacrificial pattern is used to form contact holes. Further, the contact holes 123, which are formed using the first and second sacrificial patterns 130 and 140 as a mask, may have rounded corners but a substantially quadrilateral shape with sides of a small curvature.

Although not illustrated in the drawings, in another embodiment, an etch stop layer having etch selectivity with respect to the lower insulating layer 120 may be interposed between the substrate 100 and the lower insulating layer 120.

Figure 4E:
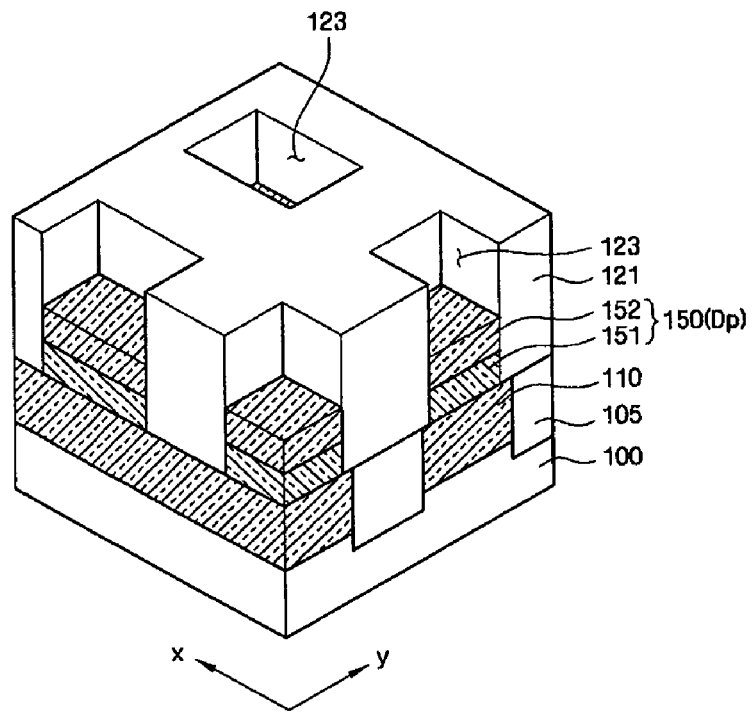

Referring to FIGS. 3 and 4e, first and second semiconductor patterns 151 and 152 are then formed within the contact holes 123 such that vertical cell diodes 150 are formed.

The first and second semiconductor patterns 151 and 152 may be formed using various techniques. For example, the first and second semiconductor patterns 151 and 152 may be grown by SEG. That is, the first semiconductor pattern 151 may be grown by using the underlying word line 110 exposed by the contact hole 123 as a seed layer, while the second semiconductor pattern 152 may be grown by using the first semiconductor pattern 151 as a seed layer. When the word line 110 is formed in a single crystal, the grown first and second semiconductor patterns 151 and 152 are also single crystals. Alternatively, the first and second semiconductor patterns 151 and 152 may be formed using SPE. Subsequently, impurities of the second conductivity type (for example, N-type) and first conductivity type (for example, P-type) are ion implanted into the first and second semiconductor patterns 151 and 152, respectively. However, if the impurities are doped in situ during the SEG or SPE process, the ion implantation may not be necessary.

In order to reduce leakage current flowing through the reverse biased vertical diode cell 150 when a reverse bias is applied thereto, the first semiconductor pattern 151 may have a lower impurity concentration than the word lines 110 and the second semiconductor pattern 152 may have a higher impurity concentration than the first semiconductor pattern 151. The reverse bias may be applied to the vertical cell diode 150 in a phase change memory cell that is not selected during a write or read operation.

Figure 4F:
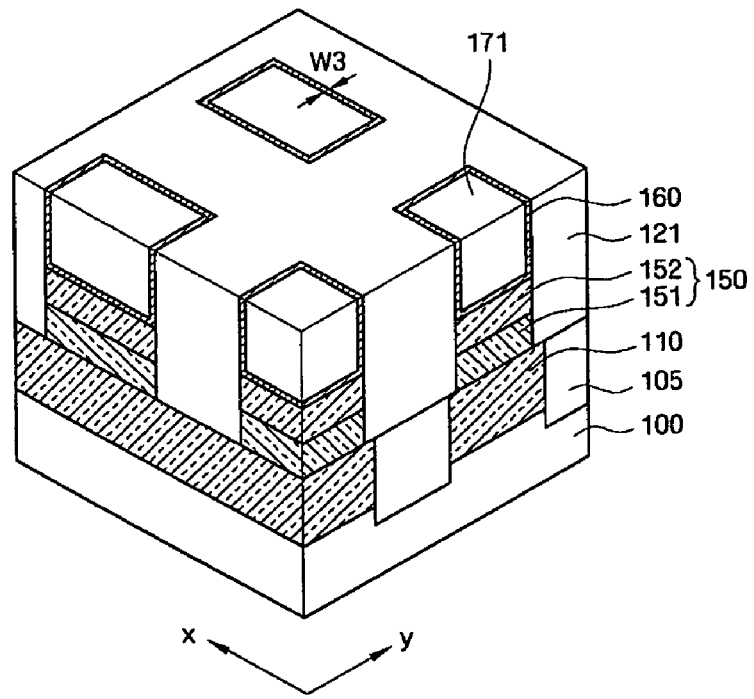

Referring to FIGS. 3 and 4f, a conductive layer 160 is conformally formed on the vertical cell diode 150 and along sidewalls of the contact hole 123. A first internal insulating layer 171 is formed on the conductive layer 160 filling up the contact hole 123. Subsequently, a planarization process such as Chemical Mechanical Polishing (CMP) or etchback is performed to expose a top surface of the lower insulating pattern 121, thereby forming a structure as illustrated in FIG. 4f.

In this embodiment, since a thickness W3 of the conductive layer 160 may determine the area of a contact between a bottom electrode and a variable resistance pattern that is described later, the conductive layer 160 may be formed using methods that allow precise control of its thickness W3. For example, atomic layer deposition (ALD), metal organic chemical vapor deposition (MO-CVD), thermal CVD, biased CVD, plasma CVD, electro magnetic resonance chemical vapor deposition (ECR CVD), or the like, may be used.

In addition, the conductive layer 160 may be made of a conductive material such as a titanium nitride (TiN) layer, a titanium aluminum nitride (TiAlN) layer, a tantalum nitride (TaN) layer, a tungsten nitride (WN) layer, a molybdenum nitride (MoN) layer, a niobium nitride (NbN) layer, a titanium silicon nitride (TiSiN) layer, a titanium boron nitride (TiBN) layer, a zirconium silicon nitride (ZrSiN) layer, a tungsten silicon nitride (WSiN) layer, a tungsten boron nitride (WBN) layer, a zirconium aluminum nitride (ZrAlN) layer, a molybdenum aluminum nitride (MoAlN) layer, a tantalum silicon nitride (TaSiN) layer, a tantalum aluminum nitride (TaAlN) layer, a titanium tungsten (TiW) layer, a titanium aluminum (TiAl) layer, a titanium oxynitride (TiON) layer, a titanium aluminum oxynitride (TiAlON) layer, a tungsten oxynitride (WON) layer and/or a tantalum oxynitride (TaON) layer.

Further, the first internal insulating layer 171 may be made of, for example, a silicon oxide layer, a silicon nitride layer or silicon oxynitride layer.

Although not illustrated in the drawings, in another embodiment, a metal silicide layer may be formed on the vertical cell diode 150 so as to serve as an ohmic layer for the vertical cell diode 150. Specifically, a metal layer containing at least one of cobalt (Co), nickel (Ni), and titanium (Ti) is formed on the vertical cell diode 150 and annealed to form a metal silicide layer.

Figure 4G:
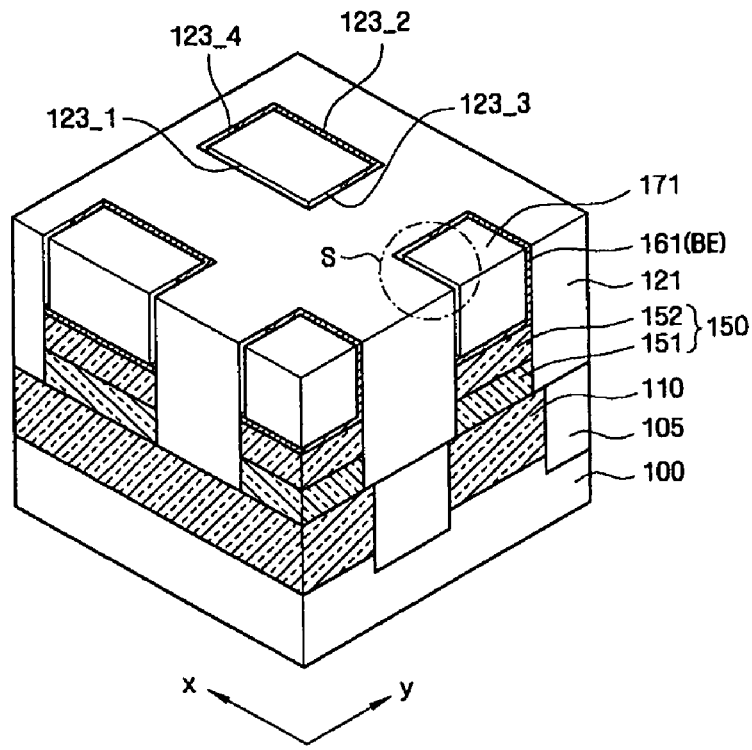
Figure 4H:
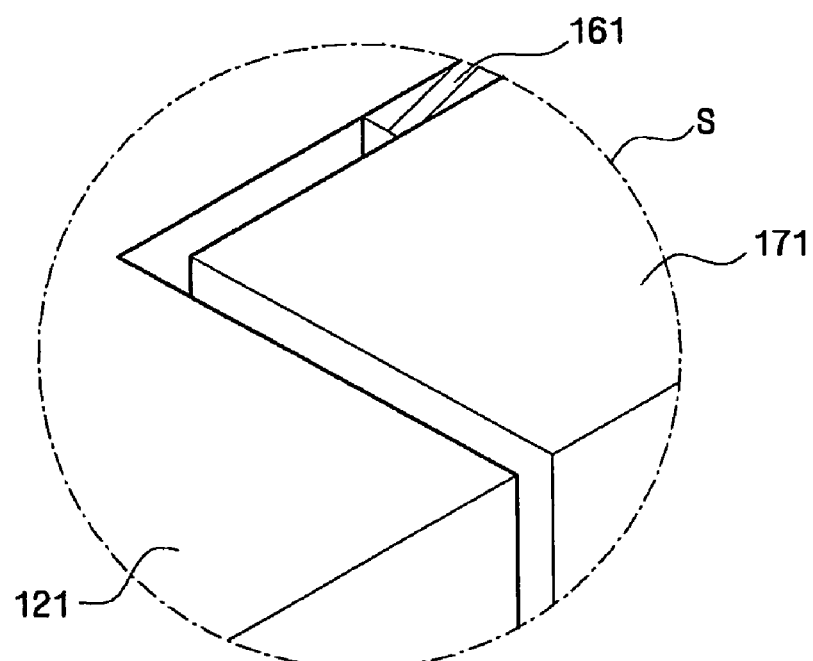

Referring to FIGS. 3, 4g, and 4h, the conductive layer 160 formed along portions of the sidewalls of the contact hole 123 is etched to form a bottom electrode 161. FIG. 4h is an enlarged view of a portion "S" of FIG. 4g.

Specifically, a third sacrificial pattern (not shown) is formed on the lower insulating pattern 121, and a portion of the conductive layer 160 formed along the sidewalls of the contact hole 123 is selectively etched using the third sacrificial pattern. The third sacrificial pattern is subsequently stripped off to form the bottom electrode 161. For example, if the contact hole 123 has opposite first and second sidewalls 123_1 and 123_2 and opposite third and fourth sidewalls 123_3 and 123_4 adjacent to the first sidewall 123_1, a portion of the conductive layer 160 formed along the first sidewall 123_1 and portions of the third and fourth sidewalls 123_3 and 123_4 adjacent thereto are etched from a top surface of the contact hole 123 to form the bottom electrode 161. The conductive layer 160 may be etched using an etching process having etch selectivity with respect to the first internal insulating layer 171 and the lower insulating layer 121.

The structure of the bottom electrode 161 formed according to this embodiment is described in more detail with reference to FIGS. 5a and 5b. The bottom electrode 161 may have a shape as illustrated in FIGS. 5a and 5b.

Referring to FIG. 5a, a bottom electrode 161_a includes a base 161_1 and first and second sidewalls 161_2 and 161_3 extending upward from edges of the base 161_1 and having different heights. The first sidewall 161_2 of the bottom electrode 161_a is formed by etching a portion of the conductive layer 160 formed along portions of the sidewalls 123_1 through 123_4 of the contact hole 123 during the etching process illustrated in FIG. 4g. The second sidewall 161_3 of the bottom electrode 161_a is protected by the third sacrificial pattern and remains intact during the etching. Referring to FIG. 5b, unlike the bottom electrode 161_a of FIG. 5a, a bottom electrode 161_b has a base 161_1 and a sidewall 161_4 extending upward from portions of edges of the base 161_1. The bottom electrode 161_b is formed by etching a portion of the conductive layer 160 formed along portions of the sidewalls 123_1 through 123_4 of the contact hole 123 from the top surface of the contact hole 123 up to the base 161_1 during the etching process shown in FIG. 4g.

That is, as illustrated in FIGS. 5a and 5b, a top surface of a portion of the bottom electrode 161 formed during the etching process illustrated in FIG. 4g may have the same height level as the top surface of the lower insulating pattern 121, and a top surface of the remaining portion of the bottom electrode 161 may be lower than the lower insulating pattern 121.

Figure 4I:
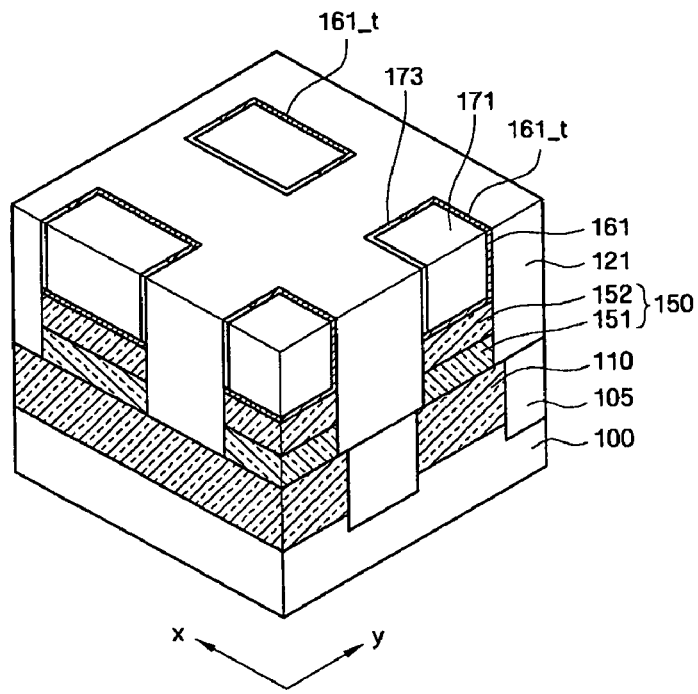

Referring to FIGS. 3 and 4i, a second internal insulating layer 173 is formed on the bottom electrode 161, so as to fill the contact hole 123. A planarization process such as CMP or etchback is subsequently performed to expose the top surface of the lower insulating pattern 121, thereby forming a structure as shown in FIG. 4i. The second internal insulating layer 173 may be formed, for example, of $SiO_2$, SiON, or SiN, similar to the first internal insulating layer 171.

Accordingly, only a portion of the bottom electrode 161, specifically, a top surface 161_t of the bottom electrode 161 having the same height level as the top surface of the lower insulating pattern 121, is exposed by the first and second internal insulating layers 171 and 173.

Figure 4J:
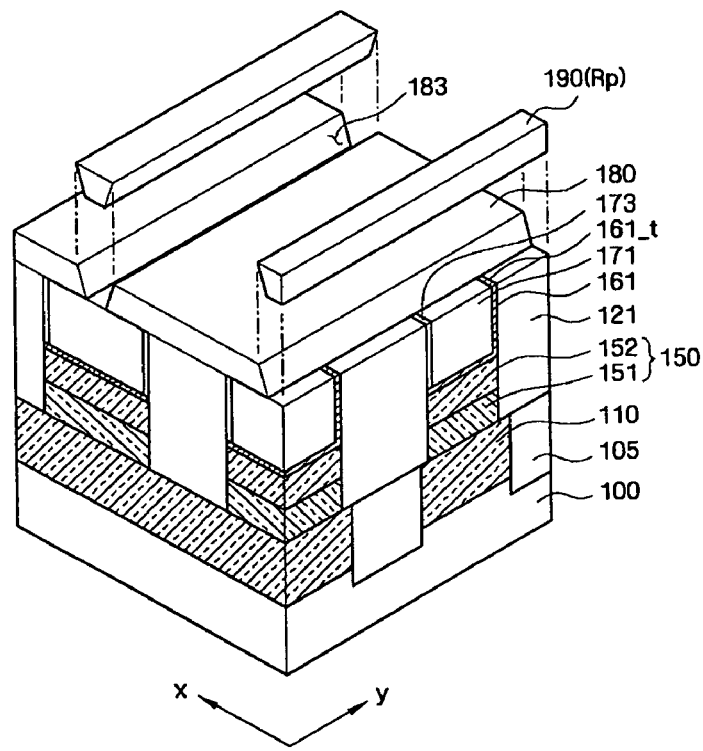

Referring to FIGS. 3 and 4j, a variable resistance pattern 190 is formed on the lower insulating pattern 121 so that a portion thereof connects to the top surface of the bottom electrode 161. For convenience of explanation, FIG. 4j illustrates the variable resistance pattern 190 and the lower insulating pattern 121 that are separated from each other.

More specifically, an upper insulating pattern 180 having third openings 183 is formed on the lower insulating pattern 121. The third openings 183 extend in the second (y) direction and overlie the contact holes 123. The third openings 183 are subsequently filled with variable resistance materials to form the variable resistance pattern 190. The variable resistance pattern 190 according to an embodiment of the present inventive concept is formed of a phase change material. For example, the variable resistance pattern 190 may be made of various types of phase change material including a binary (two-element) compound such as GaSb, InSb, InSe, $Sb_2Te_3$, and GeTe, a ternary (three-element) compound such as GeSbTe, GaSeTe, InSbTe, $SnSb_2Te_4$, and InSbGe, and a quaternary (four-element) compound such as AgInSbTe, (GeSn)SbTe, GeSb(SeTe), and $Te_{81}Ge_{15}Sb_2S_2$.

The variable resistance pattern 190 has a width (specifically, a width of a bottom surface) less than the contact hole 123 and contacts and connects to a portion of the top surface 161_t of the bottom electrode 161 exposed by the first and second internal insulating layers 171 and 173. A contact portion between the variable resistance pattern 190 and the exposed top surface 161t of the bottom electrode 161 may have substantially a straight line shape.

More specifically, because the contact hole 123 formed by the line patterns, i.e., the first and second sacrificial patterns 130 and 140 has a substantially quadrilateral shape, as described above, one side of the contact hole 123 may also have a straight line shape. Thus, when the variable resistance pattern 190 having a width less than the contact hole 123 is located on the bottom electrode 161, the contact area between the exposed top surface 161_t of the bottom electrode 161 and the variable resistance pattern 190 intersecting each other may also have a straight line shape.

If the contact portion between the variable resistance pattern 190 and the bottom electrode 161 has a straight line shape due to the quadrilateral contact hole 123, the area of contact between the variable resistance pattern 190 and the bottom electrode 161 is reduced. Further, the degree of dispersion of the area of contact that is induced at different process conditions is decreased. That is, the nonvolatile memory device fabricated by the method of manufacturing according to the exemplary embodiment of the present inventive concept provides reduced power consumption while achieving high operation reliability due to reduced dispersion of the area of contact and of resistances in the memory cells. These features are described in detail with reference to FIGS. 6a through 6c.

Figure 6A:
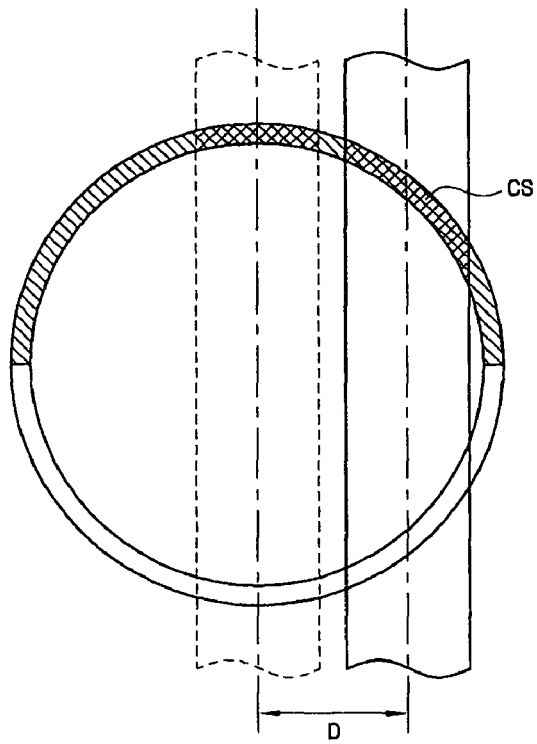
FIGS. 6a through 6c are diagrams illustrating process margins that are obtained by a method of manufacturing a nonvolatile memory device according to an embodiment of the present inventive concept.
Figure 6B:
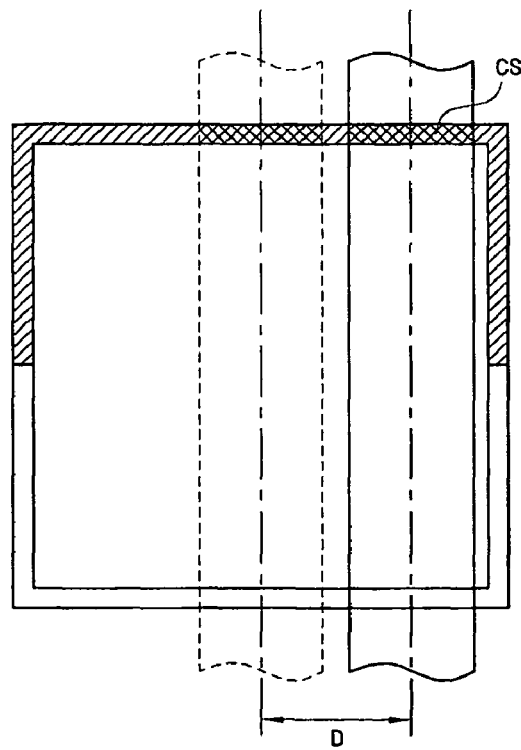
Figure 6C:
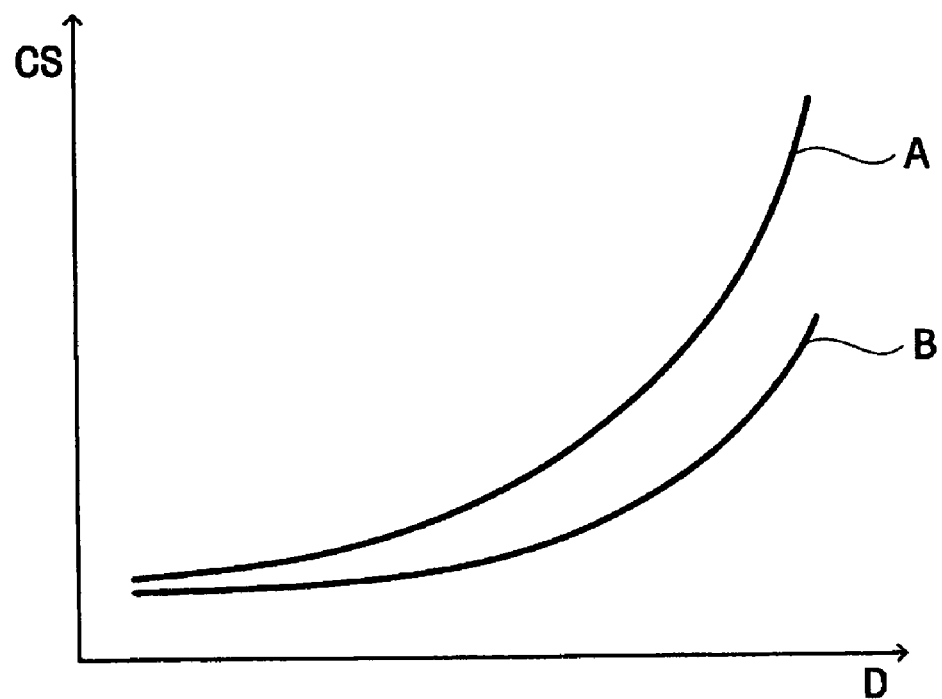

FIGS. 6a through 6c are diagrams for illustrating process margins that are obtained by a method of manufacturing a nonvolatile memory device according to an embodiment of the present inventive concept.

FIG. 6a illustrates a misalignment between a variable resistance pattern and a bottom electrode formed in a circular contact hole created by sacrificial patterns with arrays. FIG. 6b illustrates a misalignment between a variable resistance pattern and a bottom electrode formed in a quadrilateral contact hole created by first and second sacrificial patterns having a line pattern according to an embodiment of the present inventive concept. The bottom electrodes illustrated in FIGS. 6a and 6b may have the same width. The abscissa and ordinate in FIG. 6c indicate the amount of a misalignment D between the bottom electrode and the variable resistance pattern and the contact area CS therebetween, respectively. Curves A and B represent changes in the contact area CS with respect to the amount of misalignment D illustrated in FIGS. 6a and 6b, respectively.

Referring to FIGS. 6a through 6c, when the variable resistance pattern 190 is formed on the bottom electrode 161 located along portions of the sidewalls of the contact hole 123 according to the exemplary embodiment of the present inventive concept, the misalignment D between the bottom electrode 161 and the variable resistance pattern 190 may occur according to process conditions. The contact area CS between the bottom electrode 161 and the variable resistance pattern 190 as well as the degree of dispersion of resistances in the memory cells may vary depending on the amount of the misalignment D between the bottom electrode 161 and the variable resistance pattern 190.

Referring to FIG. 6c, the contact area CS between the bottom electrode 161 and the variable resistance pattern 190 with respect to the misalignment between the bottom electrode 161 and the variable resistance pattern 190 may change by a different amount depending on the shape of the contact hole 123 in which the bottom electrode 161 has been formed. More specifically, when the contact hole 123 has a circular shape as shown in FIG. 6a, since a contact portion between the bottom electrode 161 and the variable resistance pattern 190 has a curved shape, the contact area CS can change greatly according to the amount of misalignment D between both. Conversely, when the contact hole 123 has a quadrilateral shape as shown in FIG. 6b, a contact portion between the bottom electrode 161 and the variable resistance pattern 190 has a straight line shape. Thus, the contact area CS may change slightly depending on the amount of misalignment D.

Thus, the method of manufacturing a nonvolatile memory device according to the exemplary embodiment of the present inventive concept reduces the degree of dispersion of resistances in memory cells, since the contact area CS between the bottom electrode 161 and the variable resistance pattern 190 changes slightly despite the misalignment between the bottom electrode 161 and the variable resistance pattern 190. That is, the manufacturing method increases process margins.

Although the variable resistance pattern 190 is described as being formed using the upper insulating pattern 180, the present inventive concept is not limited thereto. For example, a variable resistance material layer may be formed on the substrate 100 and patterned to form the variable resistance pattern 190. The variable resistance material layer may be formed using a physical vapor deposition (PVD) technique such as sputtering exhibiting the poor step coverage. Despite the use of PVD, a phase change material layer may be formed to uniform thickness across the substrate 100, since the substrate 100 with the bottom electrode 161 has a flat surface.

While the variable resistance pattern 190 is described as having a line pattern, the variable resistance pattern 190 is not limited thereto. In another embodiment, the variable resistance pattern 190 may have the shape of an island that may be formed only near an intersection between a word line (for example, WL0) and a bit line (for example, BL0).

Although not illustrated in the drawings, the manufacturing process may include subsequent steps. Specifically, an upper electrode and bit lines are sequentially formed on the variable resistance pattern 190. The upper electrode may be formed of the same material as the bottom electrode 161. The bit lines overlying the upper electrode extend along the second (y) direction intersecting the word lines 110. The bit lines may also be coupled to the upper electrode via a plug.

Figure 7A:
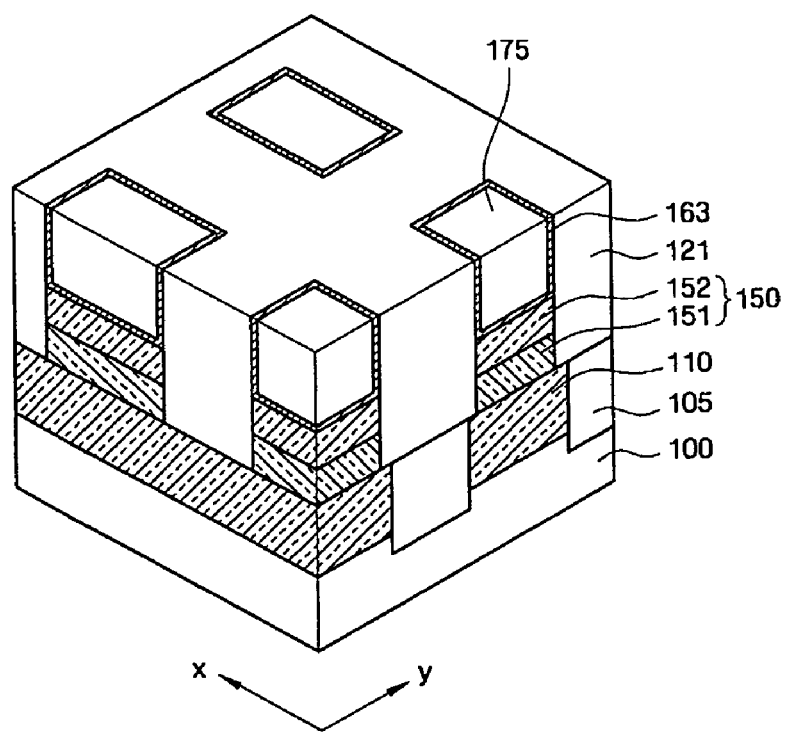
FIGS. 7a and 7b are perspective views of resultant structures of intermediate processing steps of a method of fabricating the nonvolatile memory device according to another embodiment of the present inventive concept.
Figure 7B:
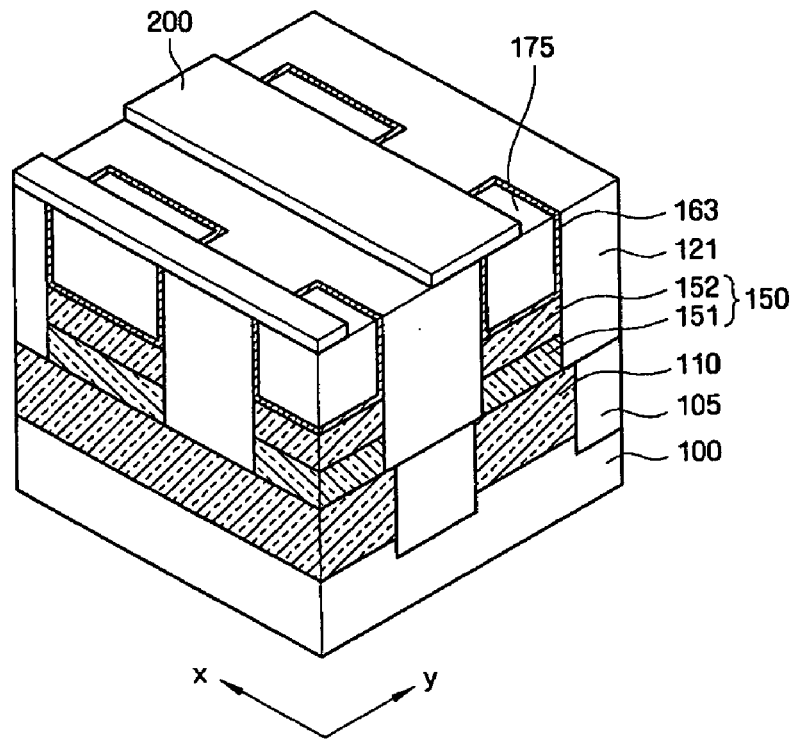

A method of manufacturing a nonvolatile memory device according to another embodiment of the preset inventive concept is described with reference to FIGS. 7a and 7b. FIGS. 7a and 7b are perspective views of resultant structures of intermediate processing steps of a method of fabricating the nonvolatile memory device according to another embodiment of the present inventive concept.

Referring to FIGS. 7a and 7b, the manufacturing method according to the present embodiment includes substantially the same steps as the manufacturing method according to the previous embodiment, except that a bottom electrode 163 is formed without etching a portion of a conductive layer formed along portions of the sidewalls of a contact hole and an external insulating layer 200 is formed on a portion of the bottom electrode 163.

Referring to FIG. 7a, a device isolation region 105 is formed within a substrate 100 of a first conductivity type (for example, P-type) to define a plurality of active regions. For example, the plurality of active regions may extend along a first (x) direction parallel to each other. Impurities of a second conductivity type (for example, N-type) are implanted into the plurality of active regions to form word lines 110.

Then, a lower insulating layer and a first sacrificial pattern having first openings are sequentially formed on the substrate 100. A second sacrificial pattern is then formed on the first sacrificial pattern to have second openings. The first and second openings may intersect each other.

The lower insulating layer is subsequently etched using the first and second sacrificial patterns as a mask to form a lower insulating pattern 121 having contact holes 123 exposing the underlying word lines 110. First and second semiconductor patterns 151 and 152 are then formed within the contact holes 123 to form vertical cell diodes 150.

A conductive layer is conformally formed on the vertical cell diode 150 and along sidewalls of the contact hole 123 and an internal insulating layer 175 is formed on the conductive layer, so as to fill up the contact hole 123. Subsequently, a planarization process such as CMP or etchback is performed to expose a top surface of the lower insulating pattern 121, thereby forming the bottom electrode 163. The bottom electrode 163 includes a base and sidewalls formed along edges of the base. Only a top surface of a sidewall is exposed by the internal insulating layer 175.

Referring to FIG. 7b, an external insulating layer 200 is formed on the lower insulating pattern 121, so as to cover a top surface of a sidewall of the bottom electrode 163. Thereby, only the top surface of a portion of the bottom electrode 163 is exposed by the internal and external insulating layers 175 and 200.

Although not illustrated in the drawings, in subsequent manufacturing steps, a variable resistance pattern is formed on the bottom electrode 163 and the external insulating layer 200, followed by the formation of an upper electrode and bit lines on the variable resistance pattern. The bit lines overlying the upper electrode extend along the second (y) direction to intersect the word lines 110. The bit lines can also be coupled to the upper electrode via a plug.

A method of manufacturing a nonvolatile memory device according to another embodiment of the present inventive concept is described with reference to FIGS. 8a through 8d. FIGS. 8a through 8d are perspective views of resultant structures of intermediate processing steps of the method of manufacturing the nonvolatile memory device according to another embodiment of the present inventive concept.

Referring to FIGS. 8a through 8d, the manufacturing method according to the present embodiment includes substantially the same steps as the manufacturing method according to the embodiment shown in FIGS. 3 and 4a through 4j, except that a bottom electrode is not self-aligned to a vertical cell diode 150.

Figure 8A:
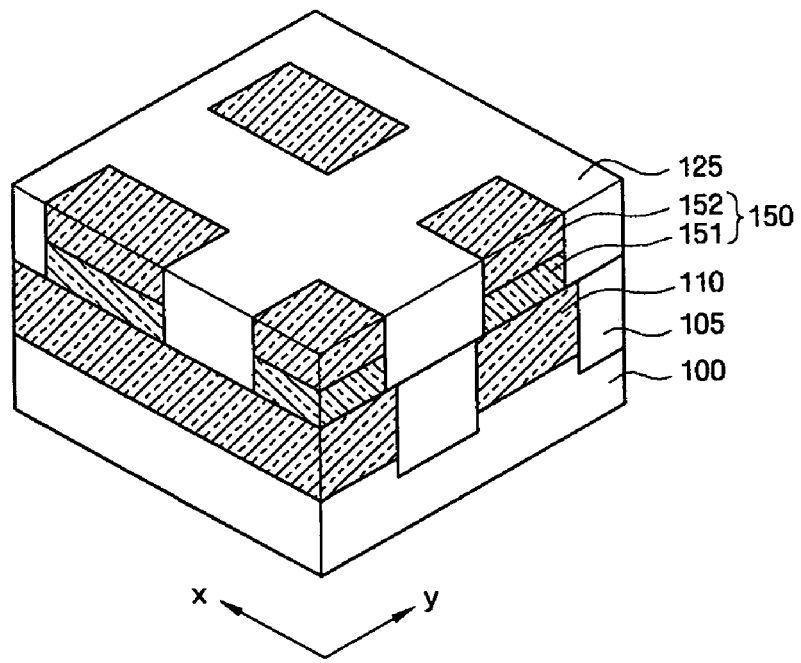
FIGS. 8a through 8d are perspective views of resultant structures of intermediate processing steps of a method of manufacturing the nonvolatile memory device according to another embodiment of the present inventive concept.

Referring to FIG. 8a, a device isolation region 105 is formed within a substrate 100 of a first conductivity type (for example, P-type) to define a plurality of active regions. For example, the plurality of active regions may extend along a first (x) direction) parallel to each other. Impurities of a second conductivity type (for example, N-type) are implanted into the plurality of active regions to form word lines 110.

A first lower insulating pattern 125 is subsequently formed on the substrate 100 to have a plurality of first contact holes exposing the underlying word lines 110. First and second semiconductor patterns 151 and 152 are then formed within the first contact hole so as to form a vertical cell diode 150.

Figure 8B:
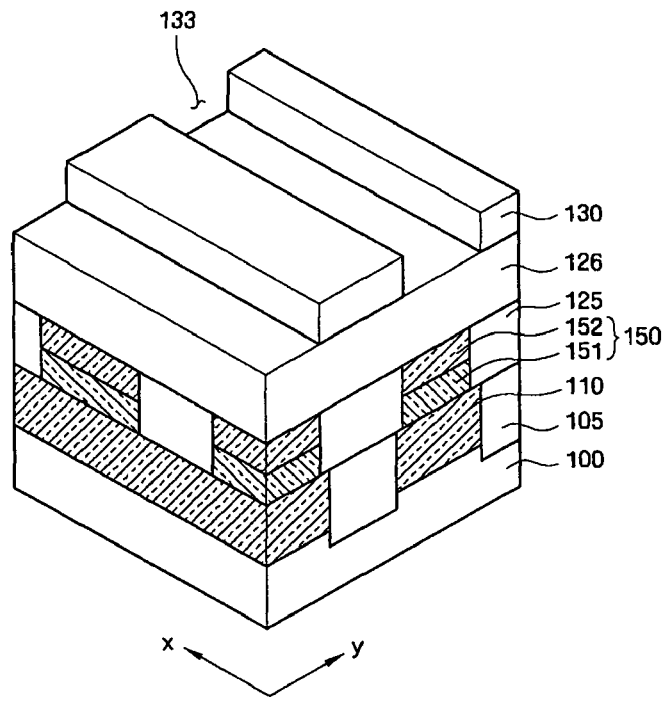

Referring to FIG. 8b, a second lower insulating layer 126 and a first sacrificial pattern 130 having first openings 133 extending in the first (x) direction are sequentially formed on the first lower insulating pattern 125. Specifically, the second lower insulating layer 126 and a first sacrificial layer are sequentially formed on the first lower insulating pattern 125, and the first sacrificial layer is patterned to form the first sacrificial pattern 130.

Figure 8C:
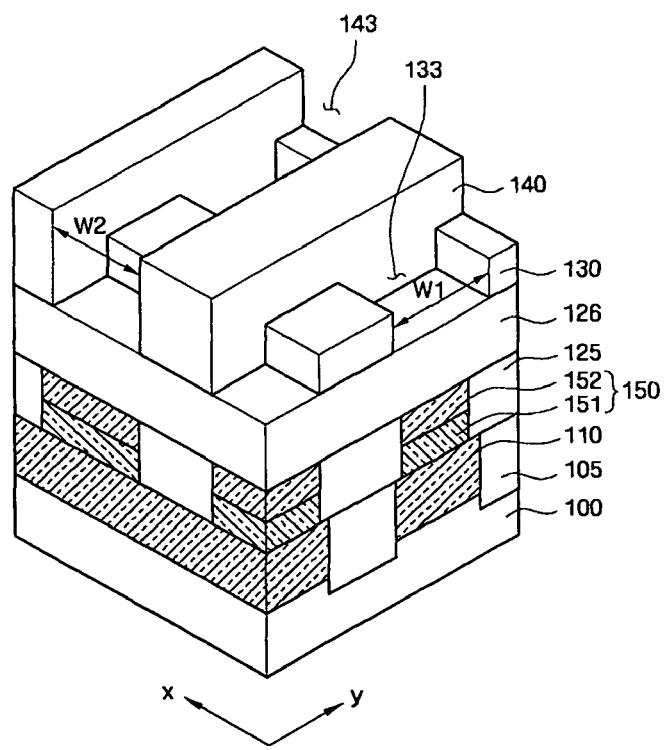

Referring to FIG. 8c, a second sacrificial pattern 140 is then formed on the first sacrificial pattern 130 to have second openings 143 extending along the second (y) direction. More specifically, a second sacrificial layer is formed on the second lower insulating layer 126 and the first sacrificial pattern 130, and, then, patterned to form the second sacrificial pattern 140.

Figure 8D:
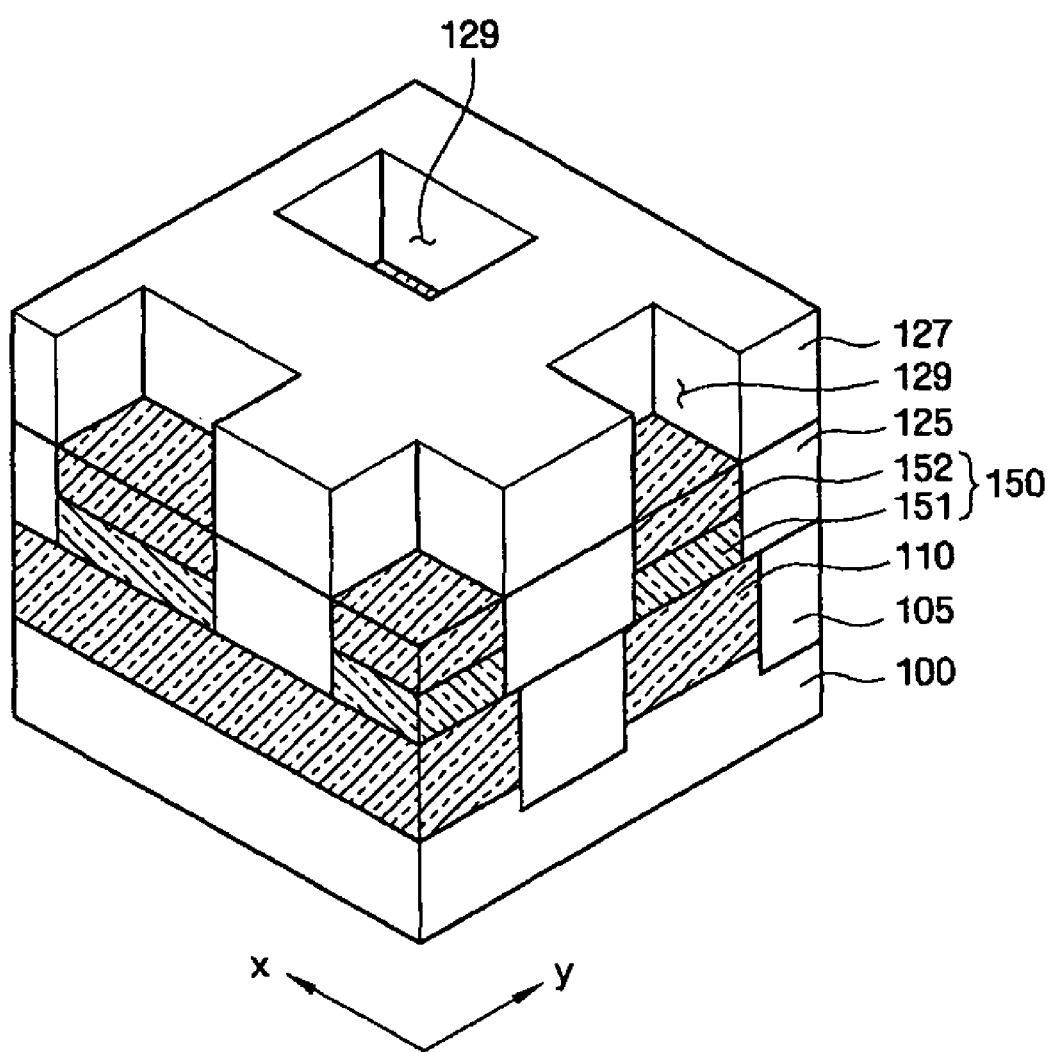

Referring to FIG. 8d, the second lower insulating layer 126 is etched using the first and second sacrificial patterns 130 and 140 to form a second lower insulating pattern 127 having second contact holes 129 that expose the underlying vertical cell diodes 150. The second contact hole 129 has a quadrilateral shape such as square or rectangle defined by a region where the first and second openings 133 and 143 intersect each other. In particular, the second contact hole 129 may have a rectangular shape in which its width W2 extending in the first (x) direction is greater than its length W1 extending in the second (y) direction. Since the subsequent steps may be the same as those shown in FIGS. 4f through 4i, a detailed descriptions thereof is omitted.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method of manufacturing a nonvolatile memory device comprising:
    forming a first sacrificial pattern having first openings extending in a first direction on a lower insulating layer;
    forming a second sacrificial pattern having second openings extending in a second direction on the lower insulating layer and the first sacrificial pattern, wherein the second openings intersect the first openings;
    etching the lower insulating layer using the first and second sacrificial patterns as a mask to form a lower insulating pattern having contact holes defined by a region where the first and second openings intersect each other;
    forming a bottom electrode in the contact holes; and
    forming a variable resistance pattern on the lower insulating pattern so that a portion of the variable resistance pattern connects to a top surface of the bottom electrode.

2. The method of claim 1, further comprising forming a vertical cell diode within the contact hole, wherein the bottom electrode is formed on the vertical cell diode.

3. The method of claim 2, wherein the forming of the bottom electrode includes conformally forming a conductive layer on the vertical cell diode and along sidewalls of the contact hole, forming a first internal insulating layer on the conductive layer to fill up the contact hole, and removing the conductive layer formed along portions of the sidewalls of the contact hole to form the bottom electrode.

4. The method of claim 3, further comprising forming a second internal insulating layer on the bottom electrode to fill the contact hole.

5. The method of claim 3, wherein the contact hole has a quadrilateral shape including opposite first and second sidewalls and opposite third and fourth sidewalls adjacent to the first sidewall, and, in the removing of the conductive layer formed along portions of the sidewalls of the contact hole, the conductive layer formed along the first sidewall and portions of the third and fourth sidewalls are etched from a top surface of the contact hole.

6. The method of claim 2, wherein the bottom electrode includes a base and a sidewall formed along edges of the base, further comprising forming an internal insulating layer on the bottom electrode to fill the contact hole and forming an upper insulating pattern on the lower insulating pattern to cover a portion of a top surface of the sidewall.

7. The method of claim 1, further comprising forming bit lines extending in the second direction on the variable resistance pattern, wherein the contact hole has a width extending along the first direction and a length extending along the second direction and the width is greater than the length.

8. The method of claim 7, wherein the variable resistance pattern extends along the second direction and the variable resistance pattern has a width less than the width of the contact hole.

9. The method of claim 1, wherein the variable resistance pattern includes a phase change material.

10. A method of manufacturing a nonvolatile memory device comprising:
    forming a first sacrificial pattern having first openings extending in a first direction on a lower insulating layer;
    forming a second sacrificial pattern having second openings extending in a second direction on the lower insulating layer and the first sacrificial pattern, wherein the second openings intersect the first openings;
    etching the lower insulating layer using the first and second sacrificial patterns as a mask to form a lower insulating pattern having contact holes defined by a region where the first and second openings intersect each other;
    forming a bottom electrode in the contact holes; and
    forming a variable resistance pattern on the lower insulating pattern electrically connected to the bottom electrode.

11. The method of claim 10, further comprising forming a vertical cell diode within the contact hole, wherein the bottom electrode is formed on the vertical cell diode.

12. The method of claim 11, wherein the forming of the bottom electrode includes conformally forming a conductive layer on the vertical cell diode and along sidewalls of the contact hole, forming a first internal insulating layer on the conductive layer to fill up the contact hole, and removing the conductive layer formed along portions of the sidewalls of the contact hole to form the bottom electrode.

13. The method of claim 12, further comprising forming a second internal insulating layer on the bottom electrode to fill the contact hole.

14. The method of claim 12, wherein the contact hole has a quadrilateral shape including opposite first and second sidewalls and opposite third and fourth sidewalls adjacent to the first sidewall, and, in the removing of the conductive layer formed along portions of the sidewalls of the contact hole, the conductive layer formed along the first sidewall and portions of the third and fourth sidewalls are etched from a top surface of the contact hole.

15. The method of claim 11, wherein the bottom electrode includes a base and a sidewall formed along edges of the base, and
    further comprising forming an internal insulating layer on the bottom electrode to fill the contact hole and forming an upper insulating pattern on the lower insulating pattern to cover a portion of a top surface of the sidewall.

16. The method of claim 10, further comprising forming bit lines extending in the second direction on the variable resistance pattern, wherein the contact hole has a width extending along the first direction and a length extending along the second direction and the width is greater than the length.

17. The method of claim 16, wherein the variable resistance pattern extends along the second direction and the variable resistance pattern has a width less than the width of the contact hole.

18. The method of claim 10, wherein the variable resistance pattern includes a phase change material.

* * * * *